(12) United States Patent
Chen

(10) Patent No.: US 7,259,962 B2
(45) Date of Patent: Aug. 21, 2007

(54) MOBILE FAN MODULE

(75) Inventor: Feng-Ming Chen, Taipei (TW)

(73) Assignee: Chenbro Micom Co., Ltd., Chung-Ho, Taipei Hsien (TW)

( * ) Notice: Subject to any disclaimer, the term of this patent is extended or adjusted under 35 U.S.C. 154(b) by 274 days.

(21) Appl. No.: 10/904,921

(22) Filed: Dec. 6, 2004

(65) Prior Publication Data

US 2006/0120040 A1    Jun. 8, 2006

(51) Int. Cl.
*H05K 7/20* (2006.01)
*H05K 5/00* (2006.01)

(52) U.S. Cl. ...................... 361/695; 454/184

(58) Field of Classification Search ............... 361/687, 361/694–695; 415/126; 454/184
See application file for complete search history.

(56) References Cited

U.S. PATENT DOCUMENTS 5,997,266 A * 12/1999 Lecinski et al. ....... 417/423.14
6,322,042 B1 * 11/2001 Nemec ..................... 248/694
6,556,437 B1 * 4/2003 Hardin ..................... 361/687
6,839,233 B2 * 1/2005 Cravens et al. ........... 361/695
2004/0184234 A1 * 9/2004 Kosugi ..................... 361/695
2004/0190246 A1 * 9/2004 Arbogast et al. .......... 361/695

* cited by examiner

*Primary Examiner*—Greg Thompson
(74) *Attorney, Agent, or Firm*—Birch, Stewart, Kolasch & Birch, LLP

(57) ABSTRACT

A fan module for use in a computer or server is disclosed to include a rack, which defines a holding chamber and has a plurality of guiding grooves symmetrically disposed at two sides inside the holding chamber, and a plurality of locating plates insertable into the rack at different elevations to carry a respective fan in the holding chamber, each locating plate having two guiding portions symmetrically disposed at two sides and insertable into two sliding grooves at same elevation inside the rack without the use of any tool.

12 Claims, 7 Drawing Sheets

MOBILE FAN MODULE

BACKGROUND OF THE INVENTION

1. Field of the Invention

The present invention relates to a fan module for use in a computer, electronic apparatus, etc., and more particularly, to a mobile fan module in which fans of different sizes may be selectively detachably installed in the rack thereof without the use of any tool.

2. Description of the Related Art

Following fast development of high technology, lighter, thinner, shorter and smaller are becoming the key words for electronic instruments, including personal computers. Electronic instruments of new generation use sophisticated semiconductor chips or devices that release heat during operation. For example, an advanced personal computer uses a sophisticated CPU (Central Processing Unit) and GPU (Graphics Processing Unit) for processing any of a variety of data. These electronic devices release much heat during operation. The amount of heat energy released by these electronic devices during operation may be relatively increased subject to their operation speed. The working temperature of a CPU is normally at about 60~95° C. In order to keep normal working of the CPU, GPU and other heat-releasing electronic devices in a computer or electronic apparatus, heat must be quickly carried away. Currently, electric fans are used to cause currents of air for dissipating heat. It is practical to use currents of air as a working medium for dissipation of heat without causing damage to electronic component parts. Various fan modules have been disclosed for this purpose. FIG. 7 shows a prior art fan having a plurality of centrifugal type turbofans B are mounted in a frame bar A1 inside a server's mainframe A. Each centrifugal type turbofan B has an exhaust hole B1 for guiding the output turbulent flow of air toward a specific electronic component part inside the mainframe A. This design of fan module is still not satisfactory in function. Because there are many component parts inside the mainframe A around the frame bar A1, it is difficult to mount/dismount the centrifugal type turbofans B with a hand tool, complicating the cleaning or repair work of the centrifugal type turbofans B. Further, because the centrifugal type turbofans B are affixed to the frame bar A1 at predetermined locations and because different models of electronic devices (CPU, chip, interface card or hard disk drive) have different arrangements and specifications, the exhaust hole B1 may be not accurately aimed at the respective heat source, thereby lowering the heat dissipation efficiency. In this case, an overheat may occur, resulting in a failure of the mainframe.

SUMMARY OF THE INVENTION

The present invention has been accomplished under the circumstances in view. According to one aspect of the present invention, the fan module is comprised of a rack and a fan detachably mounted in the rack. The rack is modularized for mass production to reduce the cost, and adapted to accommodate one of a series of fans of different sizes. The selected fan can easily and detachably be installed in the rack without the use of any tool.

According to another aspect of the present invention, the rack of the fan module is connectable to a holder frame inside a computer or server and slidable on the holder frame before fixation, so that the user can adjustably affix the fan module to the holder frame at the optimum position to dissipate heat efficiently.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The present invention will become more fully understood from the detailed description given hereinbelow and the accompanying drawings which are given by way of illustration only, and thus are not limitative of the present invention, and wherein:

DETAILED DESCRIPTION OF THE PREFERRED EMBODIMENT

Figure 1:
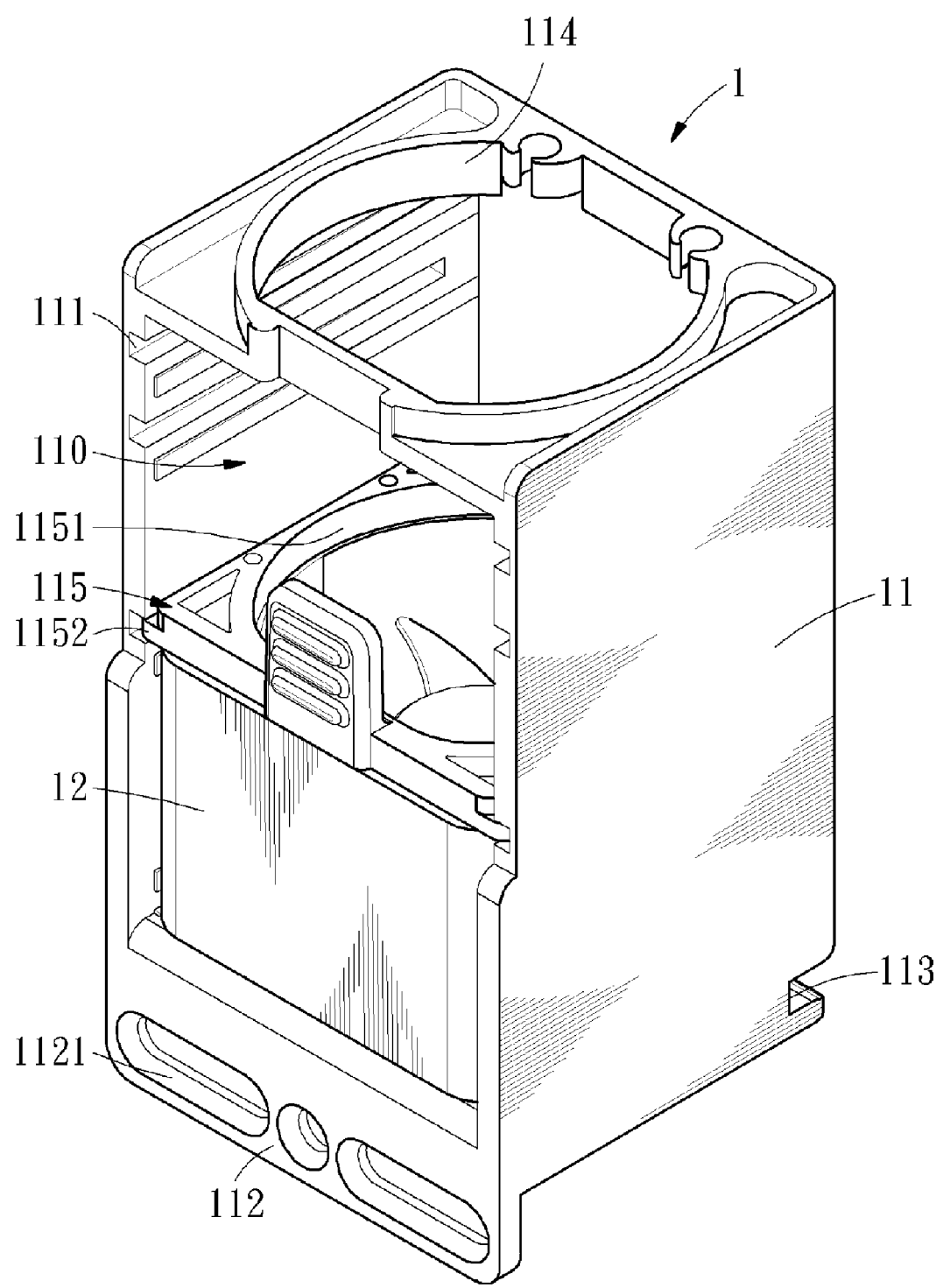
FIG. 1 is an elevational assembly view of a fan module according to the present invention.
Figure 2:
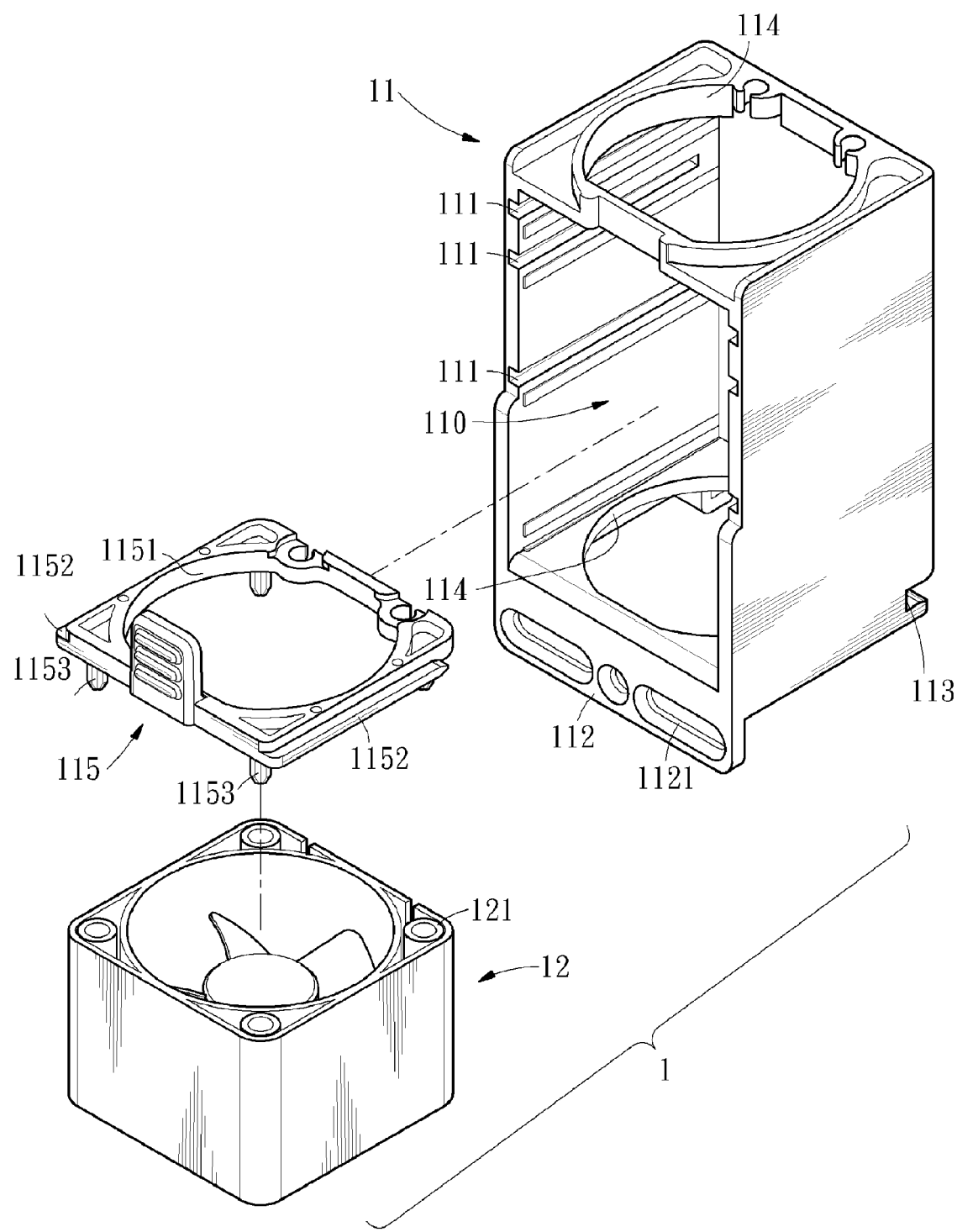
FIG. 2 is an exploded view of the fan module shown in FIG. 1.
Figure 3:
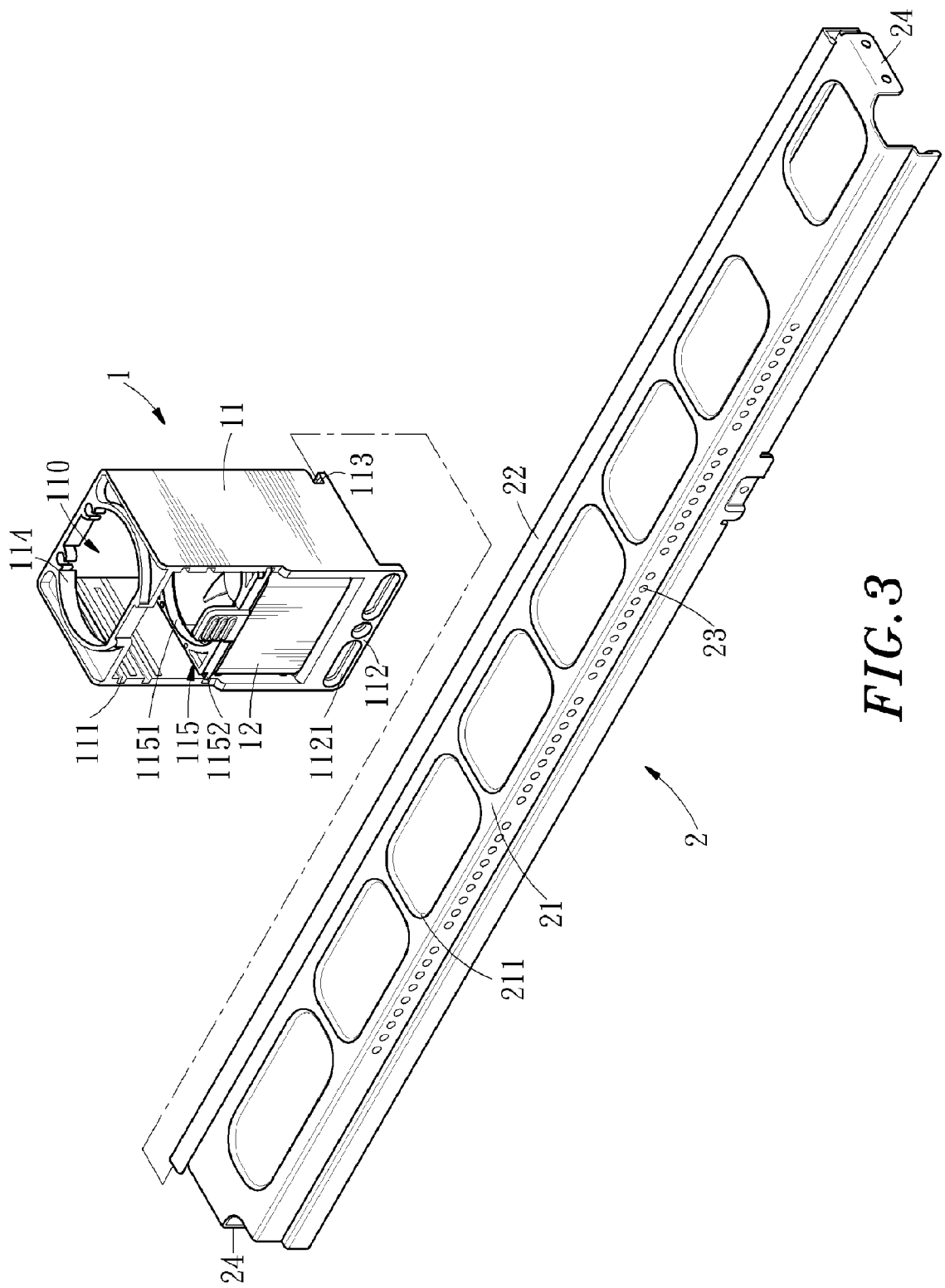
FIG. 3 is a schematic drawing showing the relationship of the present invention with a holder frame.

Referring to FIGS. 1~3, a fan module 1 in accordance with the present invention is shown comprised of a rack 11 and a fan 12. The rack 111 is a hollow case member having a holding chamber 110 for accommodating the fan 12, a plurality of guiding grooves 111 symmetrically transversely provided at two sides inside the holding chamber 110, a sliding portion 112 transversely disposed at the front bottom side in flush with the front wall, a sliding groove 113 transversely formed on the back wall near the bottom side, a plurality of elongated slots 1121 cut through the sliding portion 112 and horizontally aligned in a line, top and bottom openings 114 respectively formed in the top and bottom sides in air communication with the holding chamber 110, and at least one locating plate 115 detachably mounted in the holding chamber 110. The locating plate 115 comprises a center opening 1151 corresponding to the openings 114 of the rack 11, two guiding portions 1152 symmetrically disposed at two sides and insertable into two guiding grooves 111 at same elevation in the holding chamber 110 of the rack 11, and a plurality of bottom locating rods 1153 downwardly extending from the bottom side around the border area. The fan 12 is fastened to one locating plate 115 and inserted with the locating plate 115 into the inside of the holding chamber 110 of the rack 11, having a plurality of mounting through holes 121 vertically extended through the top and bottom sides around the border area for receiving the bottom locating rods 1153 of the locating plate 115.

Referring to FIG. 3 again, the fan module 1 may be used with a holder frame 2 in the mainframe of a personal computer or server. The holder frame 2 comprises a flat elongated frame base 21, a plurality of wind holes 211 cut through the top and bottom sides of the flat elongated frame base 21 and aligned in a line along the length of the flat elongated frame base 21, a rail 22 extended along one side, namely, the rear side of the flat elongated frame base 21 corresponding to the sliding groove 113 of the rack 11, a plurality of mounting holes 23 arranged in a line at the other side, namely, the front side of the flat elongated frame base 21, and two end flanges 24 perpendicularly downwardly extending from the two distal ends of the flat elongated frame base 21.

During installation, the fan 12 is fastened to one locating plate 115 and then inserted with the locating plate 115 into two guiding grooves 111 at same elevation in the holding chamber 110 of the rack 11, and then the fan module 1 is placed on the flat elongated frame base 21 of the holder frame 2 to have the sliding groove 113 of the rack 111 be coupled to the rail 22 of the holder frame 2 and to have the sliding portion 112 of the rack 111 be stopped at the front side of the holder frame 2, and then the fan module 1 is moved on the flat elongated frame base 21 along the rail 22 to the desired position. Because the sliding groove 113 of the rack 111 is coupled to the rail 22 of the holder frame 2 and the sliding portion 112 of the rack 111 is stopped at the front side of the holder frame 2, the fan module 1 can be moved on the flat elongated frame base 21 along the rail 22 smoothly without vibration.

Figure 4:
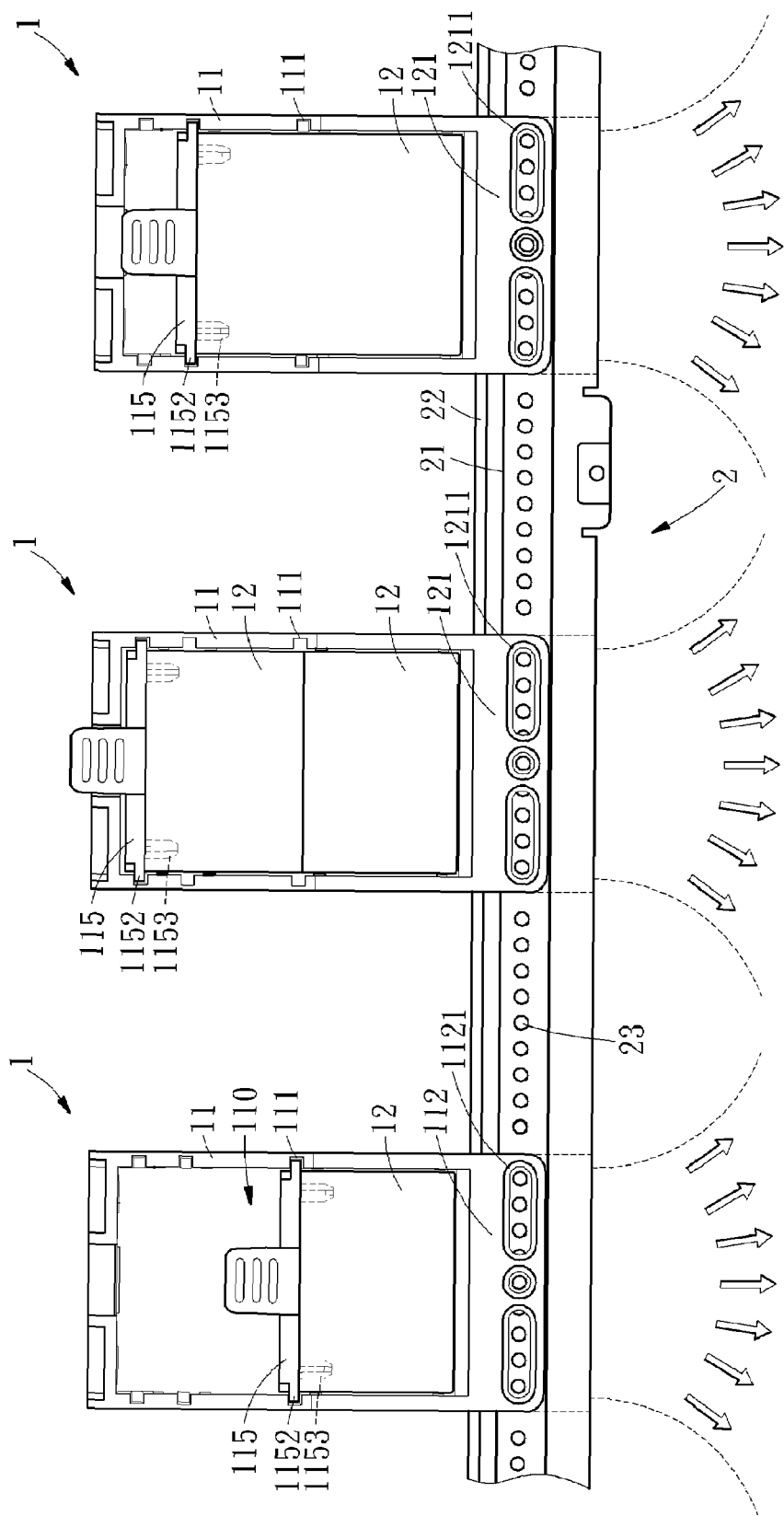
FIG. 4 is a schematic front view, showing the flowing of currents of air from fan modules at a holder frame according to the present invention.

Referring to FIG. 4, the rack 111 may accommodate a different size of fan 12, or two fans 12 may be mounted together in the holding chamber 110 of the rack 1. Because the fan 12 is fastened to one locating plate 115 and then the locating plate 115 is inserted into the inside of the rack 111 to hold the fan 12 in the holding chamber 110 of the rack 11, the user can remove the locating plate 115 and the attached fan 12 from the rack 111 for cleaning or replacement without the use of any tool. Further, when two fans 12 are mounted together in the rack 11, the fans 12 are set to cause currents of air in one direction so as to provide a fabulous amount of wind, increasing the heat dissipation power.

Figure 5:
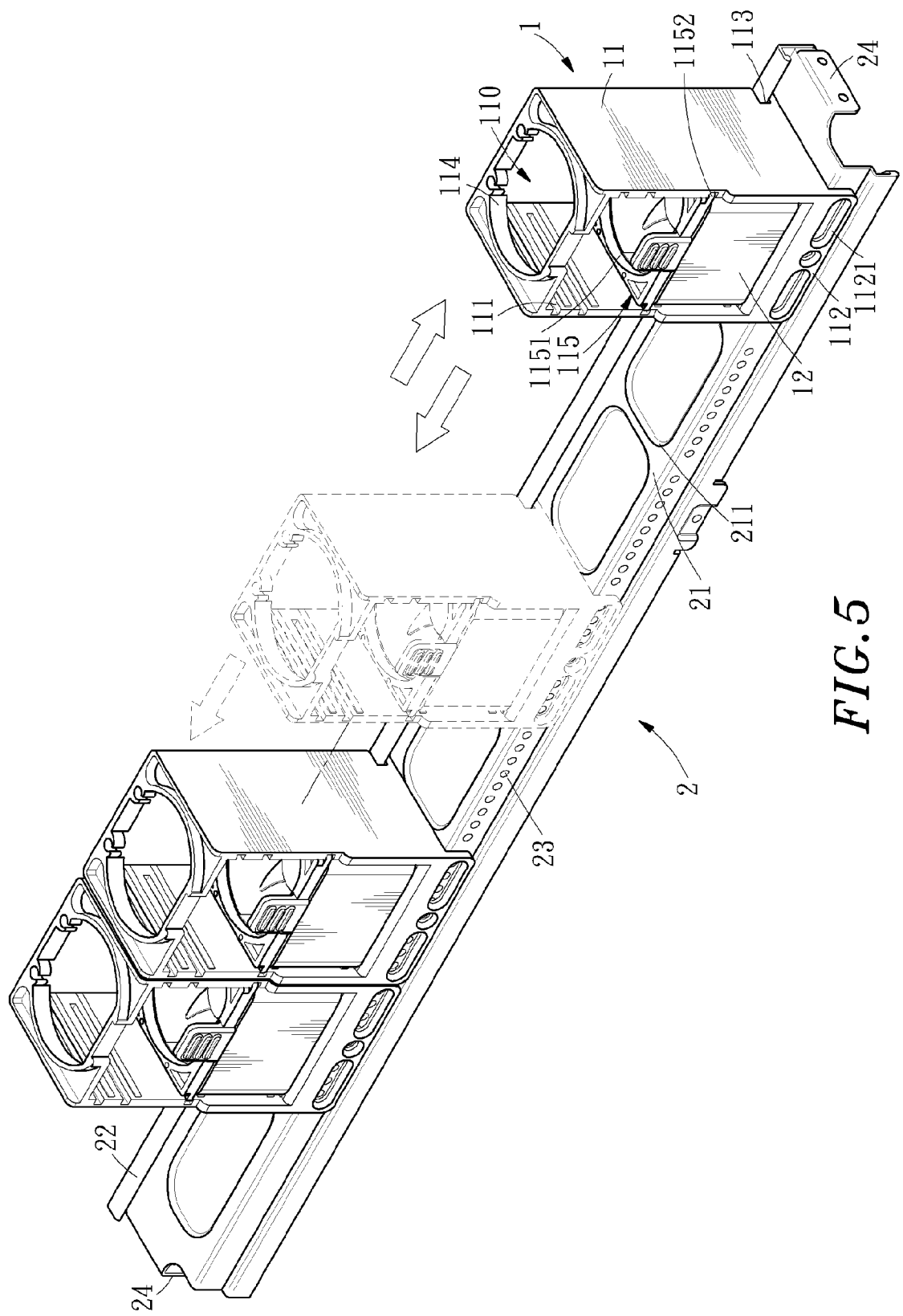
FIG. 5 is a schematic drawing showing a plurality of fan modules mounted on a holder frame and moved along the rail of the holder frame according to the present invention.

Referring to FIG. 5, the fan module 1 can be moved on the flat elongated frame base 21 along the rail 22 to the desired position to have the bottom opening 114 of the rack 111 be aimed at one wind hole 211 of the holder frame 2, and then fastening members, for example, screws (not shown) are fastened to the elongated slots 1121 of the rack 111 and the respective mounting holes 23 of the holder frame 2 to affix the fan module 1 to the holder frame 2 in the desired position. During operation, currents of air from the fan 12 pass through the bottom opening 114 of the rack 111 and the respective wind hole 211 of the holder frame 2 toward the heat source to dissipate heat from the heat source. Further, a number of fan modules 1 may be installed in the holder frame 2 to enhance the heat dissipation power, preventing accumulation of heat energy at the area of other electronic parts.

Figure 6:
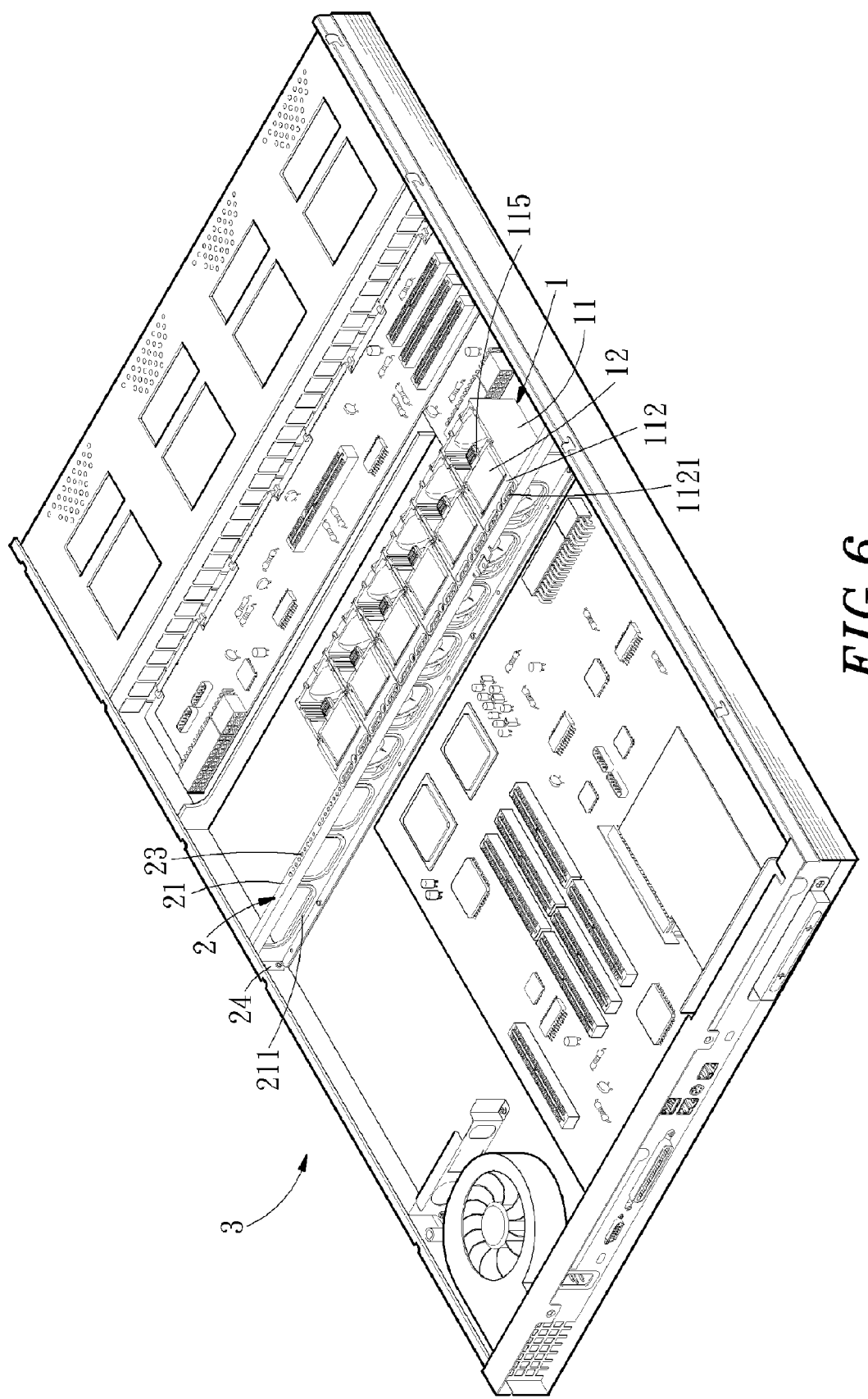
FIG. 6 is a perspective view showing a plurality of fan modules installed in a holder frame inside the mainframe of a server according to the present invention.
Figure 7:
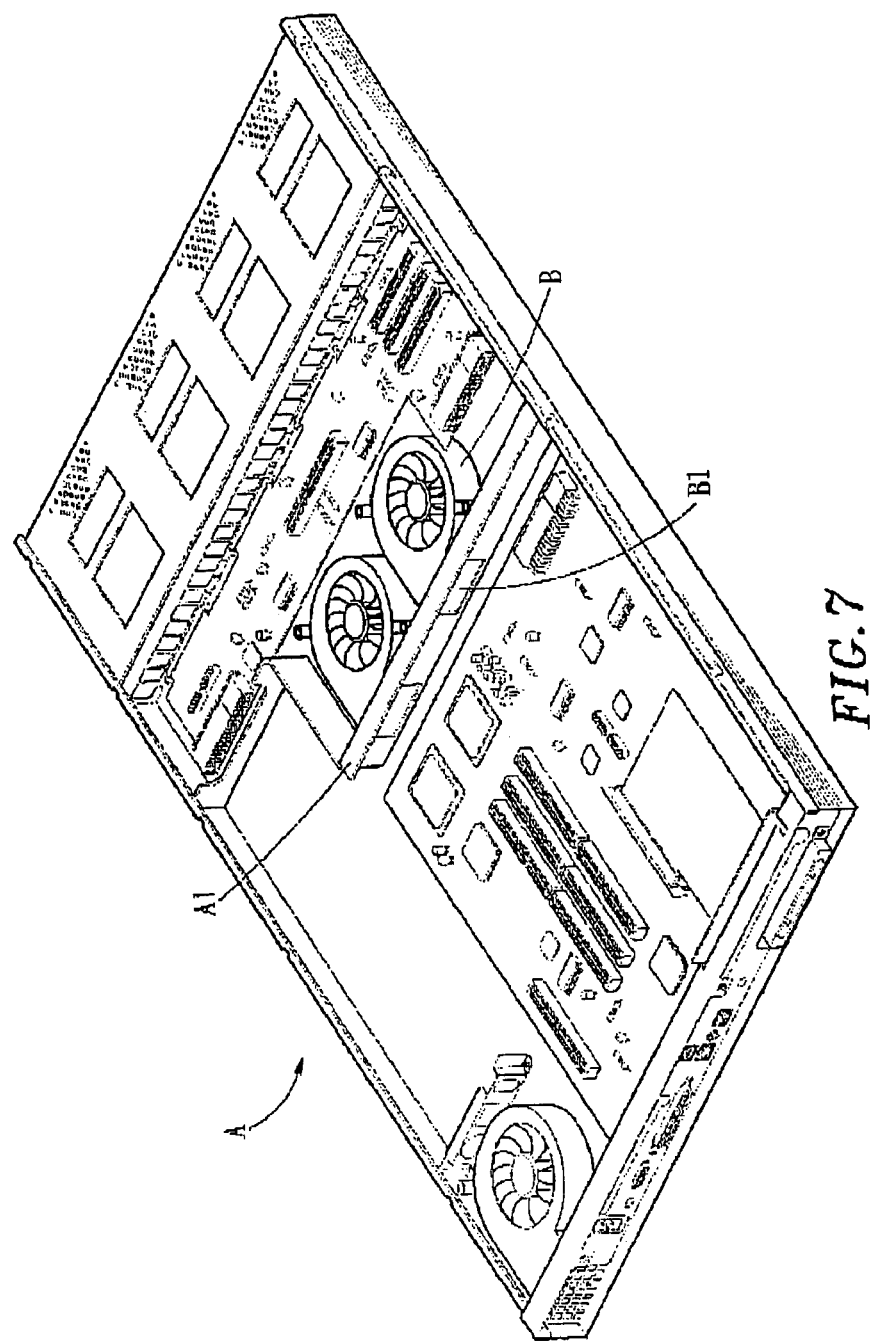
FIG. 7 illustrates a prior art fan module installed in the mainframe of a server.

FIG. 6 shows a number of fan modules 1 mounted on a holder frame 2 inside a server's mainframe 3. During installation, the end flanges 24 of the holder frame 2 are respectively affixed to the two opposite upright sidewalls of the mainframe 3 with fastening members, and then the fan modules 1 are mounted on the holder frame 2 and affixed thereto at the desired portions. The size of the holder frame 2 is determined subject to the installation space in the mainframe 3. Each fan module 1 may be provided with one or two fans 12. During operation of the server, the fans 12 of the fan modules 1 are operated to cause currents of air toward heat-releasing computer parts inside the mainframe 3, thereby cooling the temperature of the computer parts efficiently.

FIG. 6 shows an application example of the present invention in a server. Actually, the invention can also be used in any of a variety of electronic apparatus such as personal computer, industrial computer, or the like to dissipate heat from heat-releasing electronic component parts during the operation of the electronic apparatus.

As indicated above, the fan module 1 has a rack 11 with a sliding portion 112 and a sliding groove 113 for connection to a holder frame 2, allowing the user to move the fan module 1 along the rail 22 of the holder frame 2 to the desired portion in vertical alignment with one wind hole 211. When wishing to detach the fan 12 from the rack 111 for a replacement or repair work, the user can directly remove the respective locating plate 115 from the rack 111 and then detach the fan 12 from the locating plate 115 without the use of any tool. After replacement or repair work, the new or well-repaired fan 12 is fastened to the locating plate 115 and then inserted with the locating plate 115 into the rack 11 again.

A prototype of fan module has been constructed with the features of the annexed drawings of FIGS. 1~6. The fan module functions smoothly to provide all of the features discussed earlier.

The invention being thus described, it will be obvious that the same may be varied in many ways. Such variations are to be regarded as a departure from the spirit and scope of the invention, and all such modifications as would be obvious to one skilled in the art are intended to be included within the scope of the following claims.

What is claimed is:

1. A fan module, comprising:
   at least one fan;
   a rack, said rack having a holding chamber adapted to accommodate said at least one fan, and a plurality of guiding grooves symmetrically disposed at two sides of the inside of said holding chamber; and
   at least one locating plate adapted to carry said at least one fan respectively in said holding chamber of said rack, said at least locating plate having two guiding portions symmetrically disposed at two sides and insertable into two of said plurality of guiding grooves at the same elevation inside said rack,
   wherein said rack comprises a sliding portion transversely provided at a front side thereof and a sliding groove transversely provided at a rear side thereof.

2. The fan module as claimed in claim 1, wherein said rack further comprises an opening at each of top and bottom sides thereof.

3. The fan module as claimed in claim 1, further comprising a holder frame for holding said rack inside the mainframe of an electronic apparatus, said holder frame having a flat elongated frame base, a plurality of wind holes cut through top and bottom sides of said flat elongated frame base, a rail extended along a rear side of said flat elongated frame base, and a plurality of mounting holes arranged in a line along a front side of said flat elongated frame base.

4. The fan module as claimed in claim 3, wherein said holder frame further comprises two end flanges perpendicularly downwardly extending from two distal ends of said flat elongated frame base.

5. The fan module as claimed in claim 1, wherein said at least one locating plate comprises a center opening, and a plurality of bottom mounting rods for fastening to said at least one fan.

6. The fan module as claimed in claim 1, wherein said at least one fan has a plurality of vertically extended mounting through holes for fastening to said at least one locating plate.

7. A fan module, comprising:
- at least one fan;
- a rack, said rack having a holding chamber adapted to accommodate said at least one fan, and a plurality of guiding grooves symmetrically disposed at two sides of the inside of said holding chamber;
- at least one locating plate adapted to carry said at least one fan respectively in said holding chamber of said rack, said at least one locating plate having two guiding portions symmetrically disposed at two sides and insertable into two of said plurality of guiding grooves at the same elevation inside said rack; and
- a holder frame for holding said rack inside the mainframe of an electronic apparatus, said holder frame having a flat elongated frame base, a plurality of wind holes cut through top and bottom sides of said flat elongated frame base, a rail extended along a rear side of said flat elongated frame base, and a plurality of mounting holes arranged in a line along a front side of said flat elongated frame base.

8. The fan module as claimed in claim 7, wherein said rack further comprises an opening at each of top and bottom sides thereof.

9. The fan module as claimed in claim 7, wherein said rack comprises a sliding portion transversely provided at a front side thereof and a sliding groove transversely provided at a rear side thereof.

10. The fan module as claimed in claim 7, wherein said holder frame further comprises two end flanges perpendicularly downwardly extending from two distal ends of said flat elongated frame base.

11. The fan module as claimed in claim 7, wherein said at least one locating plate comprises a center opening, and a plurality of bottom mounting rods for fastening to said at least one fan.

12. The fan module as claimed in claim 7, wherein said at least one fan has a plurality of vertically extended mounting through holes for fastening to said at least one locating plate.

* * * * *